United States Patent [19]
Pitta et al.

[11] Patent Number: 5,652,599
[45] Date of Patent: Jul. 29, 1997

[54] DUAL-BAND ANTENNA SYSTEM

[75] Inventors: Thomas A. Pitta; Paul E. Peterzell; Richard K. Kornfeld, all of San Diego; Ana L. Weiland, Oceanside; Raymond C. Wallace, San Diego, all of Calif.

[73] Assignee: QUALCOMM Incorporated, San Diego, Calif.

[21] Appl. No.: 526,814

[22] Filed: Sep. 11, 1995

[51] Int. Cl.$^6$ .................................................. H01Q 1/50
[52] U.S. Cl. ..................... 343/858; 343/702; 343/722; 343/860
[58] Field of Search ............................. 343/702, 722, 343/715, 858, 850, 860; H01Q 1/10

[56]         References Cited

U.S. PATENT DOCUMENTS

| | | | |
|---|---|---|---|
| 2,096,782 | 10/1937 | Brown | 343/722 |
| 4,085,405 | 4/1978 | Barlow | 343/858 |
| 4,095,229 | 6/1978 | Elliott | 343/715 |
| 4,152,705 | 5/1979 | Kowols | 343/750 |
| 4,268,834 | 5/1981 | Henry | 343/722 X |
| 4,280,129 | 7/1981 | Wells | 343/715 |
| 4,490,727 | 12/1984 | Kowols | 343/895 |
| 4,725,845 | 2/1988 | Phillips | 343/702 |
| 4,829,274 | 5/1989 | Green et al. | 333/202 |
| 4,860,024 | 8/1989 | Egashira | 343/702 |
| 4,862,182 | 8/1989 | Egashira | 343/702 |
| 4,890,114 | 12/1989 | Egashira | 343/702 |
| 4,958,382 | 9/1990 | Imanishi | 455/277 |
| 5,014,346 | 5/1991 | Phillips et al. | 455/89 |
| 5,048,117 | 9/1991 | Aisaka et al. | 455/89 |
| 5,072,230 | 12/1991 | Taniyoshi et al. | 343/715 |
| 5,089,827 | 2/1992 | Pizon | 343/722 X |
| 5,095,541 | 3/1992 | Aisaka et al. | 455/89 |
| 5,111,213 | 5/1992 | Jahoda et al. | 343/722 |
| 5,151,708 | 9/1992 | Nakase et al. | 343/722 |
| 5,170,173 | 12/1992 | Krenz et al. | 343/702 |
| 5,204,687 | 4/1993 | Elliott et al. | 343/702 |
| 5,386,203 | 1/1995 | Ishihara | 333/129 |

FOREIGN PATENT DOCUMENTS

| | | | |
|---|---|---|---|
| 0575174 | 12/1993 | European Pat. Off. | H01P 1/213 |
| 1019335 | 1/1953 | France . | |
| 1503958 | 12/1967 | France . | |
| 53-52336 | 5/1978 | Japan | H01P 1/20 |
| 532619 | 1/1941 | United Kingdom . | |

*Primary Examiner*—Donald T. Hajec
*Assistant Examiner*—Tho Phan
*Attorney, Agent, or Firm*—Russell B. Miller; Roger W. Martin

[57]         ABSTRACT

A dual-band antenna system for use in a portable communications device is disclosed herein. The antenna system includes an antenna element for radiating electromagnetic energy within low-band and high-band wavelength ranges. In a preferred embodiment, a low-band isolator network, coupled to the antenna element, provides signal isolation between high-band and low-band signal paths during high-band operation. Similarly, a high-band isolator network provides signal isolation, during operation over the low-band range of wavelengths, between the high-band and low-band signal paths. During transmit and receive operation, low-band and high-band electromagnetic energy directed through the antenna is passed by the low-band and high-band isolator networks, respectively. Also included are low-band and high-band matching networks which couple the low-band and high-band isolator networks to low-band and high-band transceiver circuitry.

10 Claims, 2 Drawing Sheets

DUAL-BAND ANTENNA SYSTEM

BACKGROUND OF THE INVENTION

I. Field of the Invention

The present invention relates to dual-band antennas, and in particular to a dual-band antenna system for use within a portable communications device.

II. Description of the Related Art

"Dual-band" portable communication devices are assuming ever increasing importance in the field of wireless communications. For example, dual-band portable phones have been developed for operation over the cellular band (824 to 894 MHz) and the proposed Personal Communication Network (PCN) band (1.8 GHz to 1.99 GHz). A seemingly simple method for effecting transmission and reception of energy over each band would involve using separate antennas, each specifically designed for operation over a given range of frequencies. Unfortunately, the use of separate antennas would increase the cost, size and complexity of the portable phone, particularly if additional space must be allocated for retraction of each antenna.

For portable devices configured with only a single antenna, a straightforward approach of achieving dual-band operation relies on connection of the separate transmit/receive circuitry for each band directly to the antenna. Conventional chains of transmit/receive circuitry typically include, for example, a communications transceiver serially connected to a duplexer. A matching network is also provided for matching the impedance of the antenna to the serially connected duplexer and transceiver. However, in a dual-band device employing only a single antenna, the matching network of a given chain would be required to effect an impedance match between its chain and the combined impedance of the antenna with the other chain. In general, this would entail a complex, difficult design process, since both the impedance of the antenna and of the other chain would vary over frequency.

It is also conceivable that an electronic or electromechanical switch could be used to selectively connect the communications network of each band to the single antenna of the device. Unfortunately, a host of difficulties could be expected to accompany the introduction of such a switch into the dual-band device. For example, the presence of a switch within the antenna signal path would tend to increase signal loss, noise figure, and signal distortion. Moreover, additional electronics would be required to provide a control signal used to command the switch to select a desired communications band. Perhaps more significantly, the utilization of a switch could increase the susceptibility of the device to single-point failure.

SUMMARY OF THE INVENTION

The present invention provides a dual-band antenna system in which signal energy is passively bifurcated between separate signal paths connected to a single antenna element. Each signal path includes a simple matching network capable of being designed relatively easily.

The present invention is directed to a dual-band antenna system for use in a portable communications device. The antenna system includes an antenna element for radiating electromagnetic energy within low-band and high-band wavelength ranges. In a preferred embodiment a low-band isolator network, coupled to the antenna element, provides signal isolation between high-band and low-band signal paths over the high-band wavelengths. Similarly, a high-band isolator network provides signal isolation, across the low-band range of wavelengths, between the high-band and low-band signal paths. During operation, low-band electromagnetic energy is passed between the antenna and the low-band signal path by the low-band isolator network. In a similar manner electromagnetic energy within the high-band wavelength range is passed between the antenna and the high-band signal path by the high-band isolator network.

A first matching network, serially connected to the low-band isolator network, matches impedance of the antenna during low-band operation to impedance of the low-band signal path. A second matching network, serially connected to the high-band isolator network, matches impedance of the antenna over the high-band wavelength range to the impedance of the high-band signal path.

In a particular implementation, the low-band isolator network includes: (i) a first quarter-wave transmission line segment in series between the antenna element and the first matching network, and (ii) a second quarter-wave transmission line segment connected in shunt with the first transmission line segment and with the first matching network. Similarly, the high band isolator network may be realized to include a third quarter-wave transmission line segment in series with the antenna element, as well as a fourth quarter-wave transmission line segment connected in shunt with the third transmission line segment.

In an alternate embodiment, parallel and series resonant circuits are used to realize the low-band and high-band isolator networks. Each isolator network is designed to include a parallel resonant circuit connected in series with the antenna element, as well as a series resonant circuit connected in shunt with the parallel resonant circuit. The series and parallel resonant circuits of the low-band isolator network are resonant during high-band operation, while the series and parallel resonant circuits of the high-band isolator network are resonant during low-band operation.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
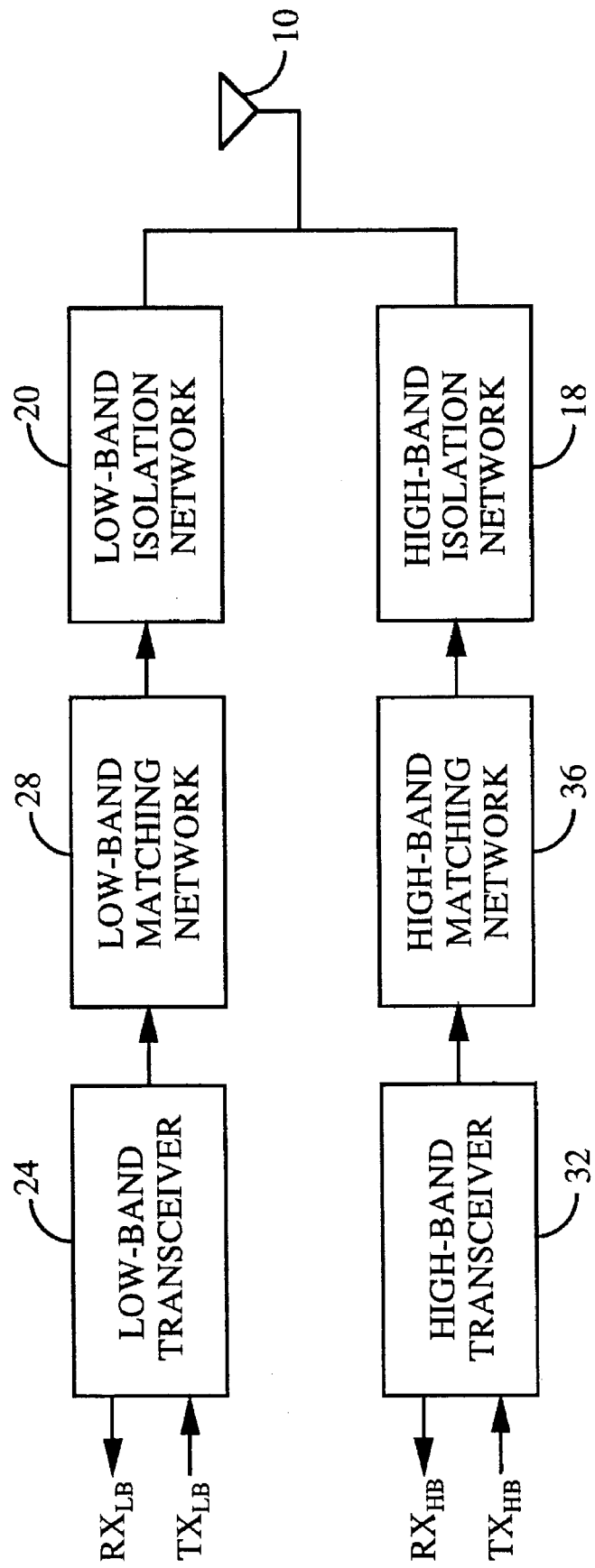
FIG. 1 shows a block diagram of an antenna system of the present invention as incorporated within a dual-band communications device.

Referring to FIG. 1, a block diagram is provided of an antenna system of the present invention as incorporated within a dual-band communications device. The antenna system includes a single antenna element 10, such as whip antenna, designed to support communication over each of the wavelength bands of the dual-band communications device. As mentioned previously, dual-band portable phones intended for operation over the cellular band (824 to 892 MHz), and over the proposed Personal Communication Network (PCN) band (1.8 GHz to 1.96 GHz), are of particular interest. However, it is to be understood that the teachings of the present invention are not constrained to any particular frequency band. Operation over the cellular and PCN bands is accommodated by realizing the antenna element 10 as a whip antenna having a length equivalent to approximately one-half of the center wavelength of the cellular band (i.e. approximately 2.5 inches), which is roughly equivalent to one-quarter of the center wavelength of the PCN band.

As is indicated by FIG. 1, an antenna feed line 14 serves to couple the antenna element 10 to high-band and low-band isolation networks 18 and 20. The feed line 14 may comprise, for example, a microstrip or stripline high-frequency transmission line. The low-band isolation network 20 is interposed between the antenna feed line 14 and a low-band signal path, in which is included the serial connection of a low-band transceiver 24 and a low-band matching network 28. In like manner, the high-band isolation network 18 is seen to be interposed between the antenna feed line 14 and a high-band signal path, in which is included the serial connection of a high-band transceiver 32 and a high-band matching network 36.

During operation, signal energy transmitted and received by the antenna element 10 which is within the high-band and low-band of wavelengths is respectively processed by the high-band and low-band transceivers 32 and 24. Within the high-band transceiver 32, a high-band duplexer (not shown) bifurcates signal energy within the high-band wavelength range into high-band transmit $TX_{HB}$ and receive $RX_{HB}$ channels. In the same way, a low-band duplexer (not shown) within the low-band transceiver 24 bifurcates signal energy within the low-band wavelength range into low-band transmit $TX_{LB}$ and receive $RX_{LB}$ channels. In alternate implementations, transmission and reception within both the high-band and low-band transceivers 32 and 34 occurs during different assigned time slots. When such a time-division multiplexed approach is employed, it becomes unnecessary to include a duplexer within each of the transceivers 32 and 34.

In accordance with one aspect of the invention, the high-band and low-band isolation networks 18 and 20 are disposed to provide signal isolation between the low-band and high-band signal paths. More particularly, the low-band isolation network 20 is disposed to present a very high impedance to the feed line 14 over a high-band (e.g., the PCN band) of operating wavelengths. Similarly, the high-band isolation network 18 presents a very high impedance (i.e., approximates an open-circuit) with respect to the feed line 14 across a low-band (e.g., the cellular band) of operating wavelengths.

By approximating an open-circuit impedance over the low-band wavelength range, the high-band isolation network 18 renders the impedance "seen" by the matching network 28 during low-band operation substantially equivalent to the impedance of the antenna 10. That is, as a result of the signal isolation provided by the high-band isolation network 18, the impedance of the high-band signal path (i.e., of the high-band transceiver and high-band matching network) makes virtually no contribution to the impedance presented to the low-band matching network. As a consequence, the design and tuning of the low-band matching network 28 is greatly simplified, and may be performed substantially independent of the impedance of the high-band signal path. The presence of the low-band isolation network 20 similarly allows the high-band matching network 36 to match the impedance exhibited by the antenna 10 during high-band operation to the impedance of the high-band signal path, irrespective of the impedance of the low-band signal path over the high-band wavelength range.

Figure 2:
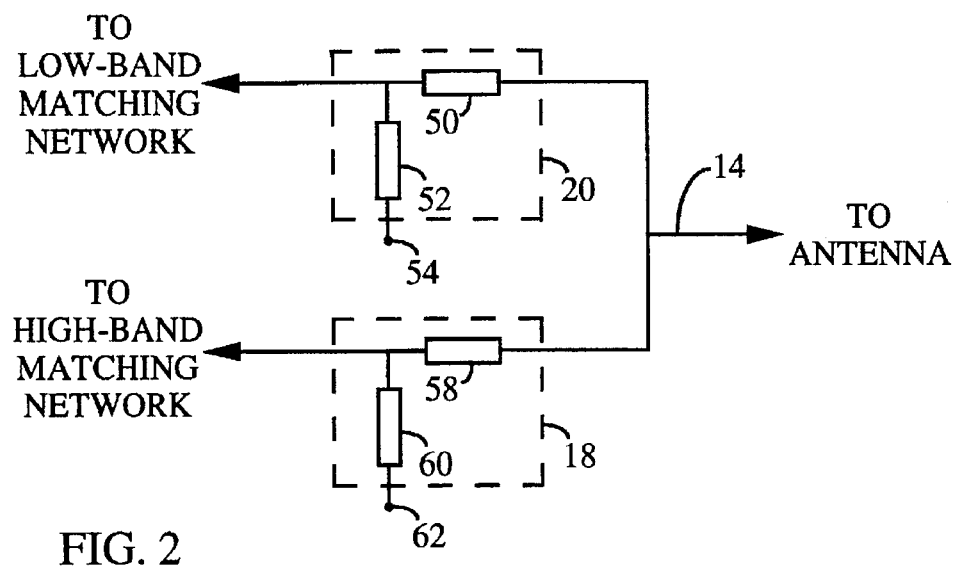
FIG. 2 is a schematic representation of a transmission line transformer implementation of high-band and low-band isolation networks included within a preferred embodiment of the invention.

Turning now to FIG. 2, a schematic representation is provided of a transmission line transformer implementation of the high-band and low-band isolation networks 20 and 18. The low-band isolation network 20 includes a first series transmission line 50, which is connected to a first shunt transmission line 52 having an open-circuited end 54. The first series and shunt transmission lines 50 and 52 are each of length $(\lambda_{HBC})/4$, where $\lambda_{HBC}$ corresponds to the center wavelength within the high-band wavelength range. Similarly, the high-band isolation network 18 includes a second series transmission line 58, which is connected to a second shunt transmission line 60 having an open-circuited end 62. The second series and shunt transmission lines 58 and 60 are each of length $(\lambda_{LBC})/4$, where $\lambda_{LBC}$ corresponds to the center wavelength within the low-band wavelength range.

The low-band and high-band transmission line transformers of FIG. 2 function to present high impedances over the high-band and low-band wavelength ranges, respectively, by way of impedance transformation of the open-circuited shunt transmission lines 52 and 60. For example, with respect to signal energy at the wavelength $\lambda_{HBC}$, the open-circuited shunt transmission line 52 behaves as an electrical short circuit. However, the impedance at the plane of the shunt transmission line 52, as seen by the high-band matching network 36 during operation at the wavelength $\lambda_{HBC}$, is made to appear as an open-circuit impedance as a consequence of the impedance transformation provided by the series transmission line 50. This desirably forces current flow into the high-band matching network 36, and prevents current flow into the low-band matching network 28, during operation over the high-band wavelength range. In like manner the high-band transmission line transformer directs current flow from the waveguide 14 into the low-band matching network 28 during low-band operation.

Figure 3:
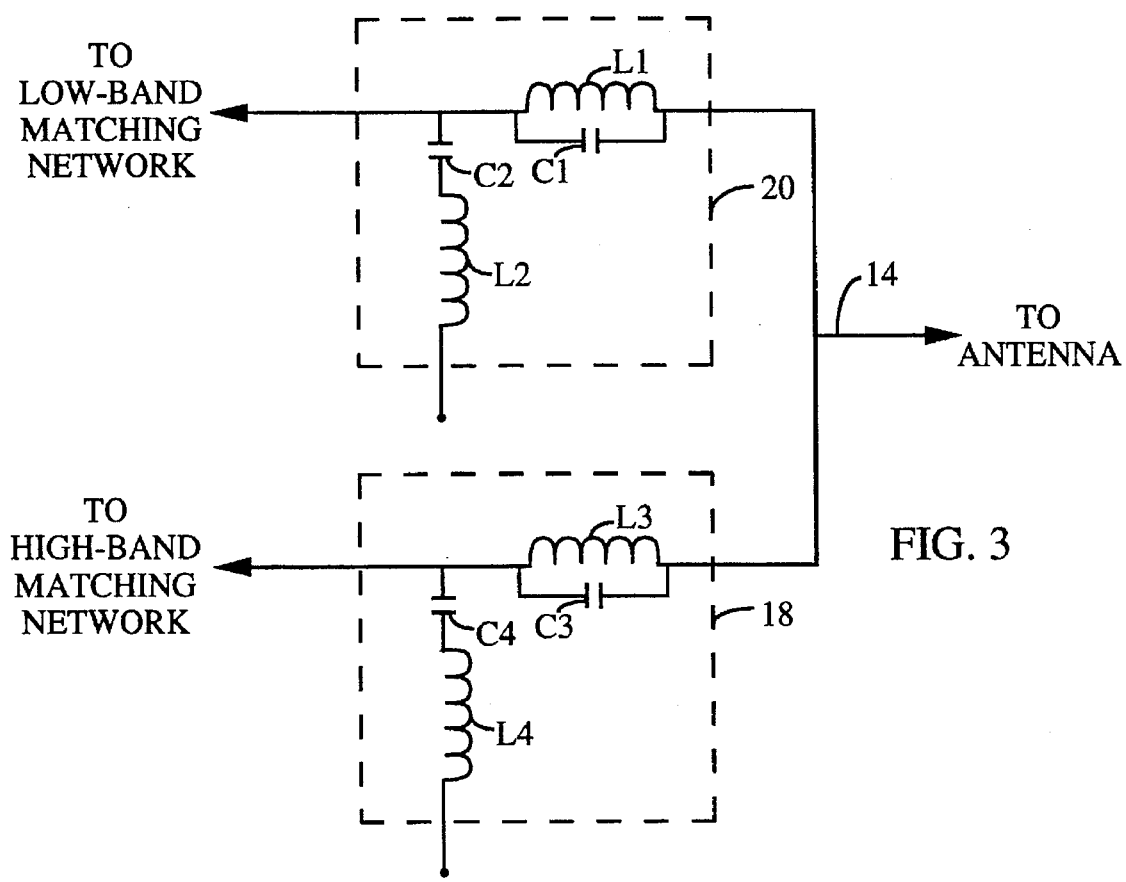
FIG. 3 shows a schematic diagram of resonant circuit implementations of the high-band and low-band isolation networks.

Referring to FIG. 3, a schematic diagram is shown of resonant circuit implementations of the high-band and low-band isolation networks 20 and 18. In FIG. 3, the low-band isolation network 20 is seen to include a first parallel LC resonant circuit comprised of inductor L1 and capacitor C1, and a first series resonant circuit comprised of inductor L2 and capacitor C2. The first series and parallel LC resonant circuits each correspond to a loss pole within the bandpass transfer characteristic associated with the low-band isolation network 20. In particular, the values of the elements L1, L2, C1 and C2 are selected such that the first series and parallel LC resonant circuits approximate open and short circuits, respectively, at the wavelength $\lambda_{HBC}$. This dual-pole bandpass isolation effectively results in the high-band matching network 36 seeing primarily only the impedance of the antenna 10 during operation over the high-band wavelength range.

Also in FIG. 3, the high-band isolation network 20 is seen to include a second parallel LC resonant circuit comprised of inductor L3 and capacitor C13, and a second series resonant circuit comprised of inductor L4 and capacitor C4. The second series and parallel LC resonant circuits are designed to form loss poles within the bandpass transfer function characterizing the high-band isolation network 20. That is, the values of the elements L3, L4, C3 and C4 are selected such that the second series and parallel LC resonant circuit approximate open and short circuits, respectively, at the wavelength $\lambda_{LBC}$. Again, this simplifies the design of the low-band matching network 28 by preventing the impedance of the high-band signal path from altering the impedance displayed by the antenna 10 during low-band operation.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A dual-band antenna system comprising:
    an antenna element for radiating electromagnetic energy within first and second wavelength bands;
    a first transmission line isolator coupled to said antenna element, said first transmission line isolator providing signal isolation over said second wavelength band, said first transmission line isolator comprising:
        a first transmission line segment in series with said antenna element; and
        a second transmission line segment connected in shunt with said first transmission line segment;
    a second transmission line isolator coupled to said antenna element, said second transmission line isolator providing signal isolation over said first wavelength band;
    a first matching network, in series with said first transmission line isolator, for matching impedance of said antenna over said first wavelength band to impedance of a first signal path; and
    a second matching network, in series with said second transmission line isolator, for matching impedance of said antenna over said second wavelength band to impedance of a second signal path.

2. The system of claim 1 wherein said first and second transmission line segments are both of a length equivalent to a quarter of a center wavelength of said second wavelength band.

3. The system of claim 2 wherein said second transmission line isolator includes a third transmission line segment in series with said antenna element, and a fourth transmission line segment connected in shunt with said third transmission line segment, said third and fourth transmission line segments both being of a length equivalent to a quarter of a center wavelength of said first wavelength band.

4. The system of claim 2 wherein said second transmission line segment includes a first end connected to said first transmission line segment, and a second open-circuited end.

5. The system of claim 4 wherein a center wavelength of said first wavelength band is a multiple of a center wavelength of said second wavelength band.

6. A dual-band antenna system for use in a communications device operative over first and second wavelength bands, said dual-band antenna system comprising:
    an antenna element for radiating electromagnetic energy within first and second wavelength bands;
    a first bandpass isolation network coupled between said antenna element and a low-band signal path, said first bandpass isolation network including a first series resonant circuit for providing signal isolation over said first wavelength band, said first bandpass isolation network comprising:
        a first resonant circuit in series with said antenna element; and
        a second resonant circuit connected in shunt with said first resonant circuit wherein said second resonant circuit approximates a short circuit at a center wavelength of said first wavelength band;
    a second bandpass isolation network coupled between said antenna element and a high-band signal path, said second bandpass isolation network including a second series resonant circuit for providing signal isolation over said second wavelength band;
    a first matching network, connected in series with said first bandpass isolation network;
    a second matching network, connected in series with said second bandpass isolation network; and
    wherein said first bandpass isolation network passes electromagnetic energy within said second wavelength band between said antenna element and said low-band signal path and said second bandpass isolation network passes electromagnetic energy within said first wavelength band between said antenna element and said high-band signal path.

7. The system of claim 6 wherein said second bandpass isolation network includes:
    a third resonant circuit in series with said antenna element; and
    a fourth resonant circuit connected in shunt with said third resonant circuit wherein said third resonant circuit approximates a short circuit at a center wavelength of said second wavelength band.

8. The system of claim 7 wherein said first resonant circuit is tuned to provide high impedance over said first wavelength band, and wherein said third resonant circuit is tuned to provide high impedance over said second wavelength band.

9. In a dual-band communications device having a first transceiver network operative over a first wavelength band and a second transceiver network operative over a second wavelength band, a dual-band antenna system comprising:
    an antenna element for radiating electromagnetic energy within said first and second wavelength bands;
    a first isolator network coupled to said antenna element, said first isolator network providing signal isolation over said second wavelength band, said first isolator network including a first series transmission line segment and a first shunt transmission line segment;
    a first impedance-matching network interposed between said first isolator network and said first transceiver;
    a second isolator network coupled to said antenna element, said second isolator network providing signal isolation over said first wavelength band, said second isolator network including a second series transmission line segment and a second shunt transmission line segment; and
    a second impedance-matching network interposed between said second isolator network and said second transceiver.

10. In a dual-band communications device having a first transceiver network operative over a first wavelength band and a second transceiver network operative over a second wavelength band, a dual-band antenna system comprising:

an antenna element for radiating electromagnetic energy within said first and second wavelength bands;

a first isolator network coupled to said antenna element, said first isolator network providing signal isolation over said second wavelength band, said first isolator network including a first series resonant circuit and a first shunt resonant circuit;

a first impedance-matching network interposed between said first isolator network and said first transceiver;

a second isolator network coupled to said antenna element, said second isolator network providing signal isolation over said first wavelength band, said second isolator network including a second series resonant circuit and a second shunt resonant circuit; and a second impedance-matching network interposed between said second isolator network and said second transceiver.

* * * * *